United States Patent
Fujisawa et al.

(10) Patent No.: US 6,765,815 B2
(45) Date of Patent: Jul. 20, 2004

(54) SEMICONDUCTOR MEMORY DEVICE HAVING A MAIN WORD-LINE LAYER DISPOSED ABOVE A COLUMN SELECTION LINE LAYER

(75) Inventors: Hiroki Fujisawa, Tokyo (JP); Koji Arai, Kodaira (JP); Chiaki Dono, Tokyo (JP)

(73) Assignees: Elpida Memory, Inc. (JP); Hitachi, Ltd. (JP); Hitachi ULSI Systems Co., Ltd. (JP)

( * ) Notice: Subject to any disclaimer, the term of this patent is extended or adjusted under 35 U.S.C. 154(b) by 0 days.

(21) Appl. No.: 10/447,893

(22) Filed: May 29, 2003

(65) Prior Publication Data

US 2004/0066698 A1 Apr. 8, 2004

(30) Foreign Application Priority Data

May 31, 2002 (JP) ...................................... 2002-159258

(51) Int. Cl.[7] .............................................. G11C 5/06
(52) U.S. Cl. ........................... 365/63; 365/51; 365/226; 365/230.06; 365/230.03
(58) Field of Search ...................... 365/51, 63, 230.03, 365/230.06, 226, 191

(56) References Cited

U.S. PATENT DOCUMENTS 5,243,560 A * 9/1993 Amishiro et al. ...... 365/189.01
5,581,508 A * 12/1996 Sasaki et al. ................ 365/200
6,249,477 B1 * 6/2001 Ohtsuki .................. 365/230.06

FOREIGN PATENT DOCUMENTS

JP 2002-015578 1/2002 ......... G11C/11/409

* cited by examiner

*Primary Examiner*—Andrew Q. Tran
(74) *Attorney, Agent, or Firm*—Hayes Soloway P.C.

(57) ABSTRACT

The present invention discloses a semiconductor memory device having a multilevel interconnection structure with no conventional limitation on the number of lines. The semiconductor memory device has a multilevel interconnection structure in which column selection lines extending in the Y direction and main word lines extending in the X direction are arranged in different layers. The layer including the column selection lines is disposed under the layer including the main word lines. In the structure, in sub-word driver areas intersecting the X direction, the main word lines are arranged in a top layer and sub-word selection lines are arranged in a layer lower than the top layer. The lower layer includes a pattern of islands. According to this interconnection structure, the number of islands can be reduced. Consequently, a plurality of power lines can be arranged between the adjacent main word lines in the sub-word driver areas.

21 Claims, 12 Drawing Sheets

PRIOR ART

SEMICONDUCTOR MEMORY DEVICE HAVING A MAIN WORD-LINE LAYER DISPOSED ABOVE A COLUMN SELECTION LINE LAYER

BACKGROUND OF THE INVENTION

1. Field of the Invention

The present invention relates to semiconductor memory devices and, more particularly, to a semiconductor memory device having a multilevel interconnection structure.

2. Description of the Related Art

Hitherto, this kind of semiconductor memory device includes a DRAM in which a memory chip is divided into banks, each bank is divided into subblocks, and then, each subblock has a plurality of memory mats arranged in a matrix form. In the DRAM with the above structure, sense amplifier (SA) areas are arranged along two opposite sides of each memory mat, at least one sub-word driver (SWD) area is disposed along another or two other opposite sides thereof. It is assumed that the SA areas are arranged on both sides of each memory mat in parallel to word lines (namely, in the X direction) and the SWD areas are arranged so as to intersect the X direction. In other words, the SWD areas are arranged in the Y direction in parallel to each other and the SA areas are arranged in the X direction in parallel to each other. Column selection lines YS extend in the Y direction.

To meet the demands of large scale integration, the following attempt is being made in the above-mentioned DRAM: Circuits for controlling or driving sense amplifier circuits and sub-word driver circuits are arranged in intersection areas (hereinbelow referred to as crossing areas) of the SA areas and the SWD areas because the crossing areas are not used as the SA areas and the SWD areas. Accordingly, the crossing areas can be used effectively. The arrangement of the SWD areas and the effective use of the crossing areas result in the high-speed operation of the DRAM.

Further, according to recent trends, in order to respond to requests to reduce the size of a chip, various lines are arranged not only between the adjacent memory mats but also over the memory mats. For example, lines including power lines, local input/output lines LIO, main input/output lines MIO, and signal lines are arranged on different layers so as to form a mesh pattern (hereinbelow referred to as a mesh arrangement). The mesh arrangement is becoming more widely used.

As this type of semiconductor memory device, for example, Japanese Unexamined Patent Publication (JP-A) No. 2002-15578 (hereinbelow, referred to as a first cited document) discloses a DRAM. For the array structure of the DRAM, a divided word driver (DWD) system is used and a hierarchical structure (multilevel interconnection) is used. In other words, input/output lines such as local I/O lines LIO, global input/output lines GIO, and similar lines are arranged on different layers. In addition, the first cited document includes an arrangement in which a sub-amplifier or a CMOS switch is disposed in a crossing area.

The multilevel interconnection on each of the memory mats of the DRAM disclosed in the first cited document will now be specifically described. As shown in FIG. 8 contained in the first cited document, the multilevel interconnection on the memory mat include word lines, bit lines, and capacitors. The word lines are integrated with the gate electrodes of respective MOSFETs formed in a substrate. The bit lines are formed above the word lines, with an insulating film therebetween. The bit lines are connected to a diffusion layer. The bit lines are formed in a first metal layer (hereinbelow, referred to as an M1 layer). The capacitors are connected to the diffusion layer. The capacitors are arranged above the bit lines. The capacitors are connected to a plate electrode. In this case, the M1 layer includes a polysilicon layer FG serving as a first layer and sub-word lines SWL.

A second metal layer (hereinbelow, referred to as an M2 layer) including main word lines MWL is arranged on the plate electrode. A third metal layer serving as a top layer (hereinbelow, referred to as an M3 layer) is further arranged on the M2 layer. The M3 layer includes column selection lines YS. The multilevel interconnection structure is formed as mentioned above. In the M3 layer, the column selection lines YS extend in the Y direction, namely, parallel to columns. In the M2 layer, the main word lines MWL extend parallel to rows so as to intersect the Y direction, namely, in the X direction.

On the other hand, the multilevel interconnection in each of sub-word driver (SWD) areas will now be described. The SWD areas each have a sub-word driver included in peripheral circuits surrounding the memory mat. This multilevel interconnection comprises the M2 layer and the M3 layer. The M2 layer includes the main word lines MWL, X-direction signal lines (arranged parallel to the word lines), and meshed power lines. These lines are arranged in the X direction. The M3 layer includes sub-word-selection signal lines FXT and FXB to select a word line, power lines used in the SWD area, power lines used for circuits in the adjacent crossing area, and main I/O lines MIO. These lines are arranged in the Y direction.

As mentioned above, the first cited document discloses the following structure: In the memory mats and the SWD areas for the peripheral circuits, the main word lines MWL are arranged in the X direction in the M2 layer under the M3 layer. On the other hand, the column selection lines YS and the sub-word-selection signal lines FXT and FXB are arranged in the Y direction in the M3 layer on the M2 layer. The lines YS and the lines FXT and FXB are needed for the memory mats and the SWD areas.

It turns out that when the main word lines MWL are arranged in the X direction in the M2 layer over the memory mats and the SWD areas, the arrangement of the lines in the SWD areas is limited. Specifically speaking, it is necessary to arrange the sub-word-selection signal lines FXT and FXB to select a word line and the power lines in each SWD area. The lines FXT and FXB and the power lines have to be electrically connected to the sub-word lines SWL arranged in the M1 layer.

In the multilevel interconnection structure in which the sub-word-selection signal lines FXT and FXB and the power lines are arranged in the M3 layer (top layer), therefore, it is necessary to electrically connect the sub-word-selection signal lines FXT and FXB and the power lines in the M3 layer to the sub-word lines SWL in the M1 layer through the M2 layer in the SWD area. In addition, it is necessary to electrically connect the sub-word-selection signal lines FXT and FXB and the power lines in the M3 layer to the diffusion layer and the gates under the M1 layer. In this instance, it is necessary to consider that the number of sub-word-selection signal lines FXT and FXB is larger than the number of main word lines MWL and the number of lines FXT and FXB is also larger than the number of sub-word lines SWL.

Accordingly, in the M2 layer, it is necessary to form a pattern of islands for connecting the lines FXT and FXB in the M3 layer to the lines SWL in the M1 layer. It is also necessary to arrange the lines for connection in the SWD area in the M2 layer. In other words, in the M2 layer in the SWD area, it is necessary to form islands for electrically connecting the lines FXT and FXB to the M1 layer in addition to the lines MWL, the X-direction signal lines, and the meshed power lines. In this case, the following technique is used in the SWD area: In the M2 layer, the lines MWL, the X-direction signal lines, and the meshed power lines are arranged so as to avoid the islands connected to the lines FXT and FXB. Accordingly, in the multilevel interconnection structure disclosed in the first cited document, the number of lines other than the lines MWL in the M2 layer is limited by the islands formed in the M2 layer and the lines for connection in the SWD area.

The following are considered to be the disadvantages of the above-mentioned conventional array interconnection structure: As the integration density of the DRAM becomes higher in the future, the size of each array will become larger and the number of circuits arranged in each crossing area will also become larger. Accordingly, the number of signal lines for driving these circuits will also increase. The number of power lines used in the array will also increase because the low-voltage operation is desired. These signal lines and the array power lines principally extend from row decoders XDEC between the main word lines MWL in the X direction, thus supplying signals and power to the memory mats. In the above-mentioned interconnection structure, since the number of lines in the X direction is limited, it may not be possible to arrange the necessary signal lines and power lines.

Figure 12:
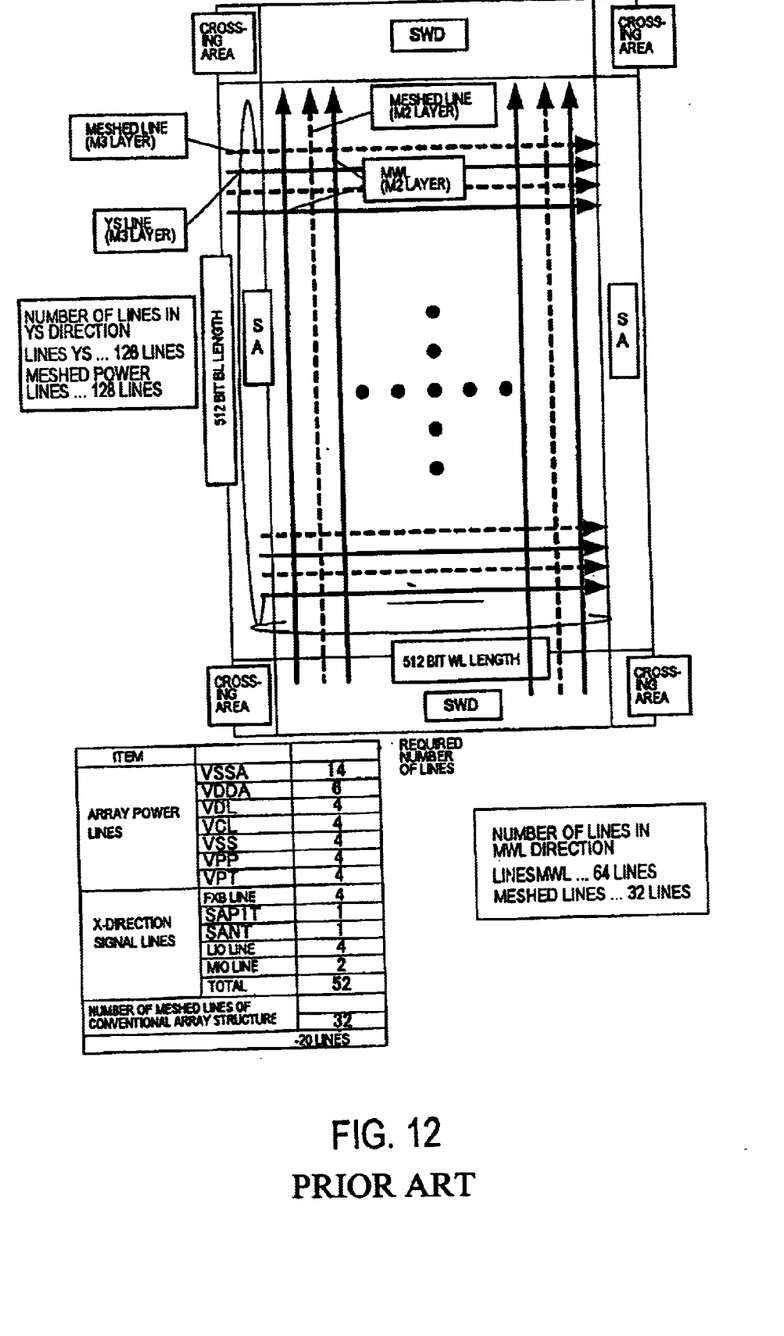
FIG. 12 includes a diagram showing the multilevel interconnection structure of a conventional semiconductor device in order to point out the disadvantages of this structure.

FIG. 12 shows a conventional multilevel interconnection structure. The problems of this structure will now be described with such a specific example. Referring to FIG. 12, lines are arranged in the M2 and M3 layers in a memory mat. In the conventional array structure, as shown in FIG. 12, the lines MWL are arranged in the X direction in the M2 layer and the lines YS are arranged in the Y direction in the M3 layer.

In this interconnection structure, it is assumed that the size of the memory mat is 512×512 bits and eight sub-word lines are provided for every main word line (8SWL/1MWL) in the arrangement of each of the SWD areas. Accordingly, the number of lines MWL arranged in the memory mat is 64 (512/8). In the actual interconnection, for the number of X-direction signal lines (parallel to the rows) and array power lines (meshed lines) capable of passing through the SWD area, only one line is arranged per two lines MWL. The reason is that the islands are formed in the M2 layer in the SWD areas and the layout of lines in the M2 layer is limited. Therefore, the number of meshed lines is 32.

On the other hand, in the circuits of the memory mat, the necessary number of signal lines and power lines extending from the row decoder XDEC in the array is 52 per memory mat, as is obvious from TABLE in FIG. 12. However, it is impossible in the conventional layout because only 32 lines can be arranged in the conventional array structure.

The above-mentioned interconnection structure is conventionally used. According to the structure, the lines extending parallel to the column selection lines YS (in the YS direction) are arranged in the top layer and the lines extending parallel to the main word lines MWL are arranged in the layer (lower layer) under the top layer. The main I/O lines MIO are arranged in the YS direction in the top layer (M3 layer). In the interconnection structure, the flexibility of the meshed lines arranged parallel to the main word lines MWL, namely, in the X direction, is low. The lines have to be arranged according to a predetermined rule.

In other words, in the case of disposing the lower layer (M2 layer) parallel to the main word lines (in the X direction), it is necessary to use the lower layer (M2 layer) for the interconnection in the sub-word drivers, thus limiting the layout of the meshed lines arranged parallel to the main word lines MWL in the array. Therefore, only one line is arranged between the two main word lines MWL.

In addition to the power lines for the memory mat or array, signal lines for circuits in the crossing areas may be arranged along the main word lines MWL in some cases. In other words, the number of lines arranged along the lines MWL is larger than that arranged along the lines YS. In the conventional interconnection structure, when the number of signal lines increases owing to a change in the circuits in the crossing areas, the increased number of lines may affect the chip size.

As mentioned above, in the conventional memory device, the arrangement in the M2 layer including the lines MWL on the memory mats (memory arrays) extends over the SWD areas and the SA areas serving as the peripheral circuits. In fact, the disadvantages of this structure are not taken into consideration.

SUMMARY OF THE INVENTION

It is an object of the present invention to provide a semiconductor memory device in which the conventional disadvantages are overcome. These disadvantages are caused when an interconnection structure on memory mats (memory arrays) extends over areas for sub-word drivers and sub-amplifiers serving as peripheral circuits.

Another object of the present invention is to provide a semiconductor memory device having an interconnection structure capable of sufficiently coping with an increase in the number of signal lines and power lines in the future.

Further another object of the present invention is to provide a semiconductor memory device having a layout in which the arrangements of lines used in a conventional array structure are transposed with each other.

According to the present invention, an interconnection structure includes a top layer (a third metal layer: M3 layer) extending along main word lines and a lower layer (second metal layer: M2 layer) extending along column selection lines. Main input/output lines are arranged parallel to the main word lines in the M3 layer. The top layer is not used to connect lines in sub-word drivers. Thus, each interval between meshed lines, arranged between the main word lines, can be increased. Consequently, on the top layer in the interconnection structure, power lines and signal lines are arranged along the main word lines in arrays with high efficiency. The flexibility of the layout of meshed lines can be increased and the chip size can be reduced.

Further, aspects of the present invention will now be described hereinbelow.

According to an aspect of the present invention, there is provided a semiconductor memory device including: a plurality of memory mats each including a plurality of memory cells arranged along columns and along rows, the columns being arranged in the Y direction and the rows being arranged in the X direction; sense amplifier areas arranged around each memory mat so as to intersect the Y direction; and sub-word driver areas arranged around each memory mat so as to intersect the X direction, wherein column selection lines and main word lines are arranged on the memory mats, the column selection lines extending in the Y direction, the main word lines extending in the X direction, and a layer including the column selection lines is disposed under a layer including the main word lines.

In this aspect, preferably, each of the sub-word driver areas includes a layer including sub-word selection lines and the layer including the main word lines, and the layer including the main word lines is disposed on the layer including the sub-word selection lines.

Preferably, a layer including sub-word lines is arranged as a first metal layer under the layer including the sub-word selection lines, and the layer including the sub-word selection lines is disposed as a second metal layer.

Preferably, the main word lines are arranged in the X direction at predetermined intervals, the layer including the main word lines is arranged as a third metal layer on the second metal layer, and the third metal layer further includes a power line extending in the X direction between the adjacent main word lines.

Preferably, a plurality of power lines are arranged between the adjacent main word lines.

Preferably, the first metal layer includes a pattern of islands connected to the sub-word selection lines.

Preferably, each of the sense amplifier areas includes a first metal layer including bit pair lines extending in the Y direction and a second metal layer including the column selection lines, and the second metal layer including the column selection lines is disposed on the first metal layer.

Preferably, each of the sense amplifier areas has device regions constituting sense amplifiers arranged in a layer under the first metal layer, a third metal layer including power lines and signal lines electrically connected to the device regions is arranged on the second metal layer, and the power lines and the signal lines in the third metal layer extend in the X direction.

Preferably, the second metal layer including the column selection lines has a pattern of islands through which the power lines and the signal lines in the third metal layer connect to the device regions.

Preferably, the pattern of islands is formed in the second metal layer so as to correspond to sense-amplifier drive lines arranged in the third metal layer, and the islands are connected to the respective sense-amplifier drive lines.

Preferably, the semiconductor memory device according to this aspect further has crossing areas which are arranged around each memory mat and where the sense amplifier areas and the sub-word driver areas are not formed. Each of the crossing areas may include first lines connected to the lines arranged in the adjacent sub-word driver area and second lines connected to the lines arranged in the adjacent sense amplifier area.

Preferably, the first lines are arranged in a layer under a layer including the second lines.

Preferably, the first lines include sub-word selection lines connected to the sub-word selection lines arranged in the adjacent sub-word driver area and power lines, and the second lines include power lines for driving the sense amplifiers in the adjacent sense amplifier area.

Preferably, the semiconductor memory device according to this aspect further includes crossing areas which are arranged around each memory mat and where the sense amplifier area and the sub-word line area are not formed. Each of the crossing areas may include a sub-amplifier connected to sense amplifiers arranged in the adjacent sense amplifier area.

Preferably, the semiconductor memory device further includes crossing areas which are arranged around each memory mat and where the sense amplifier areas and the sub-word line areas are not formed. Each of the crossing areas may include a CMOS switch.

According to another aspect of the present invention, there is provided a semiconductor memory device including: sub-word driver areas including main word lines and sub-word selection lines, wherein a layer including the sub-word selection lines is disposed under a layer including the main word lines.

Preferably, in this aspect, the main word lines are arranged at intervals and extend in the X direction so as to connect to main word lines of memory mats, and the sub-word selection lines are arranged in the layer under the layer including the main word lines and extend in the Y direction intersecting the X direction.

Preferably, sub-word lines are arranged in the X direction in a layer under the layer including the sub-word selection lines.

Preferably, a plurality of power lines are arranged in the X direction between the adjacent main word lines.

DESCRIPTION OF THE PREFERRED EMBODIMENTS

A semiconductor memory device according to a first embodiment of the present invention will now be described hereinbelow with reference to the drawings.

Figure 1A:
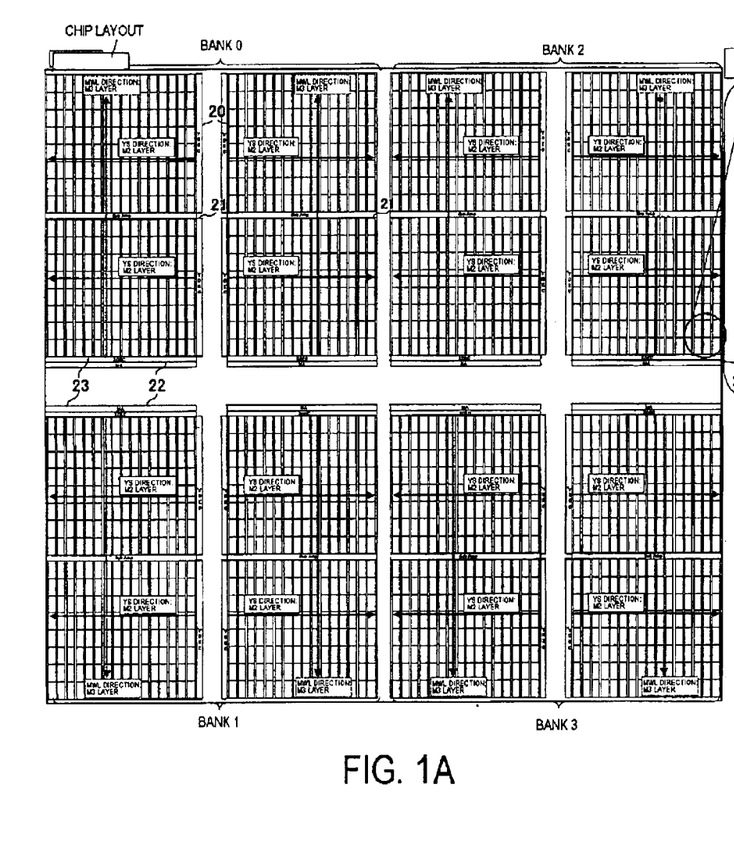
FIG. 1A schematically shows the entire layout of a semiconductor device according to the present invention.
Figure 1B:
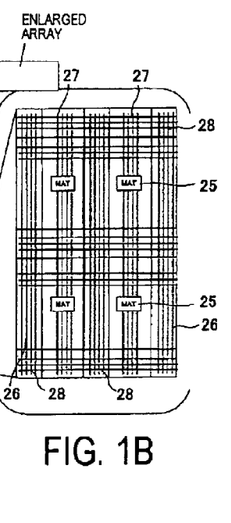
FIG. 1B is an enlarged view of a part of the layout.

The schematic architecture of the semiconductor memory device according to the first embodiment of the present invention will now be described with reference to FIGS. 1A and 1B. FIG. 1A shows the schematic layout design of a chip of the semiconductor memory device according to the present invention. FIG. 1B is an enlarged view of one part of the layout design. Referring to FIG. 1A, the chip is divided into four banks BANK0, BANK1, BANK2, and BANK3. The banks BANK0 to BANK3 each have two subblocks, which are separated from each other with Y decoders YDEC 20 therebetween. Each subblock has a plurality of memory mats. Sub-amplifier areas 21 are laterally arranged on the middle portions of the respective subblocks. Main amplifier areas 22 and main-word-driver and control-circuit areas (hereinbelow, referred to as MWD areas) 23 are concentrated at the ends of the banks BANK0 to BANK3, namely, on the middle portion of the chip (the midsection of the layout in FIG. 1A). As mentioned above, the concentration of the sub-amplifier areas 21 in the middle portions of the respective subblocks permits the centralized control of a plurality of sub-amplifiers arranged in the sub-amplifier areas 21. Thus, advantageously, the area of the layout can be reduced.

In each subblock, column selection lines YS extend from the Y decoders 20. The lines YS extend laterally in FIG. 1A. On the other hand, main word lines MWL extend from the MWD areas 23. The lines MWL extend longitudinally in FIG. 1A. In this case, the direction in which the lines YS extend is called the Y direction or the YS direction and the direction in which the lines MWL extend is called the X direction.

The chip layout shown in FIG. 1A is characterized in that the lines YS extending in the Y direction are arranged in a second metal layer (hereinbelow, referred to as an M2 layer) on a semiconductor substrate, and the lines MWL extending in the X direction are disposed in a third metal layer (hereinbelow, referred to as an M3 layer). Hitherto, the lines YS are arranged in the M3 layer and the lines MWL are disposed in the M2 layer in a conventional layout. According to the present invention, the lines YS are arranged in the M2 layer and the lines MWL are arranged in the M3 layer. Each bank consists of memory arrays. As enlarged and shown in FIG. 1B, each memory array comprises a plurality of memory mats (hereinbelow, referred to as MATs) 25 and peripheral circuits formed around the MATs 25. In the example in FIG. 1B, sense amplifier (SA) areas 26 are arranged in the X direction on both sides of each MAT 25 (namely, on both the right and left sides of each MAT 25 in FIG. 1B). Sub-word driver (SWD) areas 27 are arranged in the Y direction on both sides of each MAT 25 (namely, on both the upper and lower sides of each MAT 25 in FIG. 1B). Further, lines are arranged in portions where the SA areas 26 intersect the SWD areas 27 around each MAT 25, namely, in crossing areas 28.

As is clear from the brief description with reference to FIG. 1A, on the MATs 25, the lines YS are arranged in the Y direction in the M2 layer and the lines MWL are arranged in the X direction in the M3 layer. The M3 layer is formed on the M2 layer.

In the SA areas 26 of the peripheral circuits shown in FIG. 1B, the M2 layer includes the lines YS extending in the Y direction and meshed power lines. The M3 layer includes sense-system signal lines, local input/output lines LIO, and array power lines. On the other hand, in the SWD areas 27, the M2 layer includes sub-word-line selection signal lines (hereinbelow, referred to as sub-word selection lines), power lines, and crossing-area power lines. The M3 layer includes X-direction signal lines including the lines MWL extending in the X direction, meshed power lines, and main input/output lines MIO. The M3 layer is a top layer. In the crossing areas 28, the M2 layer includes lines which extend to the adjacent SWD area 27 and connect to the lines in the SWD area 27. The M3 layer includes lines which extend to the adjacent SA area 26 and connect to the lines in the SA area 26.

As shown in FIG. 1A, the lines MWL extending in the X direction are arranged in the M3 layer and the lines YS extending in the Y direction are disposed in the M2 layer. The arrangement means that the conventional arrangement in the M2 layer in the SWD areas 27, the SA areas 26, and the crossing areas 28 for the array circuits is interchanged with that in the M3 layer. Consequently, the number of signal lines and power lines extending from row decoders XDEC can be increased and the lines can be arranged so as to avoid layout-restricted portions in the SWD areas 27.

Figure 2:
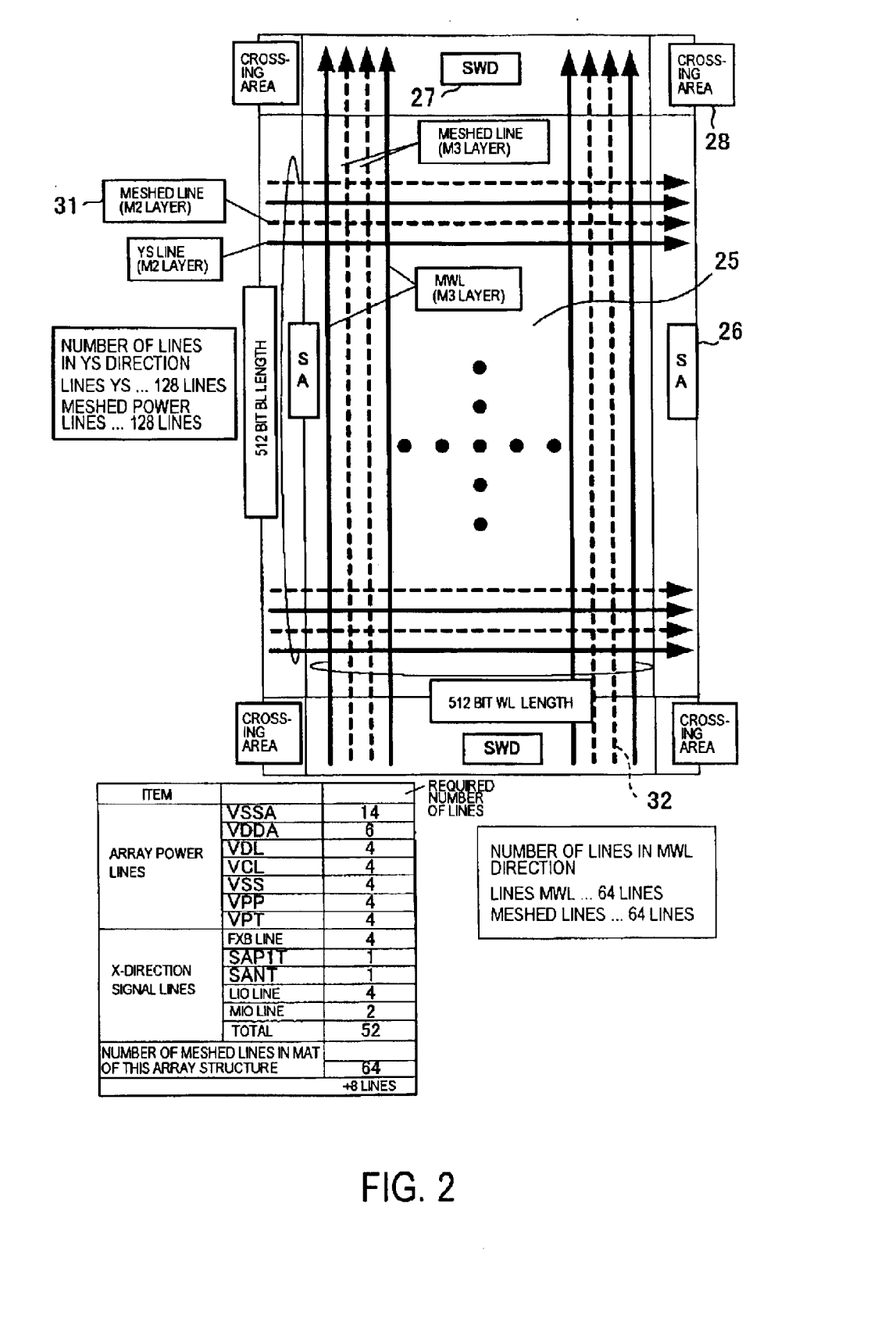
FIG. 2 includes a further enlarged view of the semiconductor device shown in FIG. 1B in order to explain the advantages of the present invention in more detail.

It is assumed that the layout of the semiconductor memory device according to the first embodiment of the present invention is divided into portions. The respective portions will now be described hereinbelow. The layout of lines of each MAT 25 shown in FIG. 1B will now be described with reference to FIG. 2. In this case, sub-word lines SWL and bit lines are arranged in a first metal layer (hereinbelow, referred to as an M1 layer), which is not shown, on the semiconductor substrate. The M2 layer is arranged on the M1 layer. In the M2 layer, the lines YS and the meshed power lines are arranged in the Y direction. Referring to FIG. 2, the MAT 25 has a capacity of 512×512 bits. The 128 lines YS are arranged in the Y direction in the M2 layer of the MAT 25. 128 meshed power lines 31 (shown by broken lines) are arranged so that each power line is disposed between the adjacent lines YS. On the other hand, in the M3 layer of the MAT 25, the 64 main word lines MWL are arranged in the X direction. Meshed lines 32 are also arranged in the M3 layer so that two lines 32 are disposed between the adjacent lines MWL. In other words, 64 meshed lines 32 can be arranged in total. The reason why the 64 meshed lines 32 can be arranged in the X direction is that each interval between the lines MWL in the M3 layer can be wide enough in the SWD areas 27 located on the upper and lower sides of the MAT 25, as will be described later.

In the conventional layout, the maximum number of mesh lines arranged between the lines MWL in the X direction is 32. According to the present invention, the number of meshed lines arranged in the X direction can be doubled. This means that the layout according to the present invention realizes an interconnection structure which can cope with an increase in the number of power lines and that of X-direction signal lines.

Figure 3:
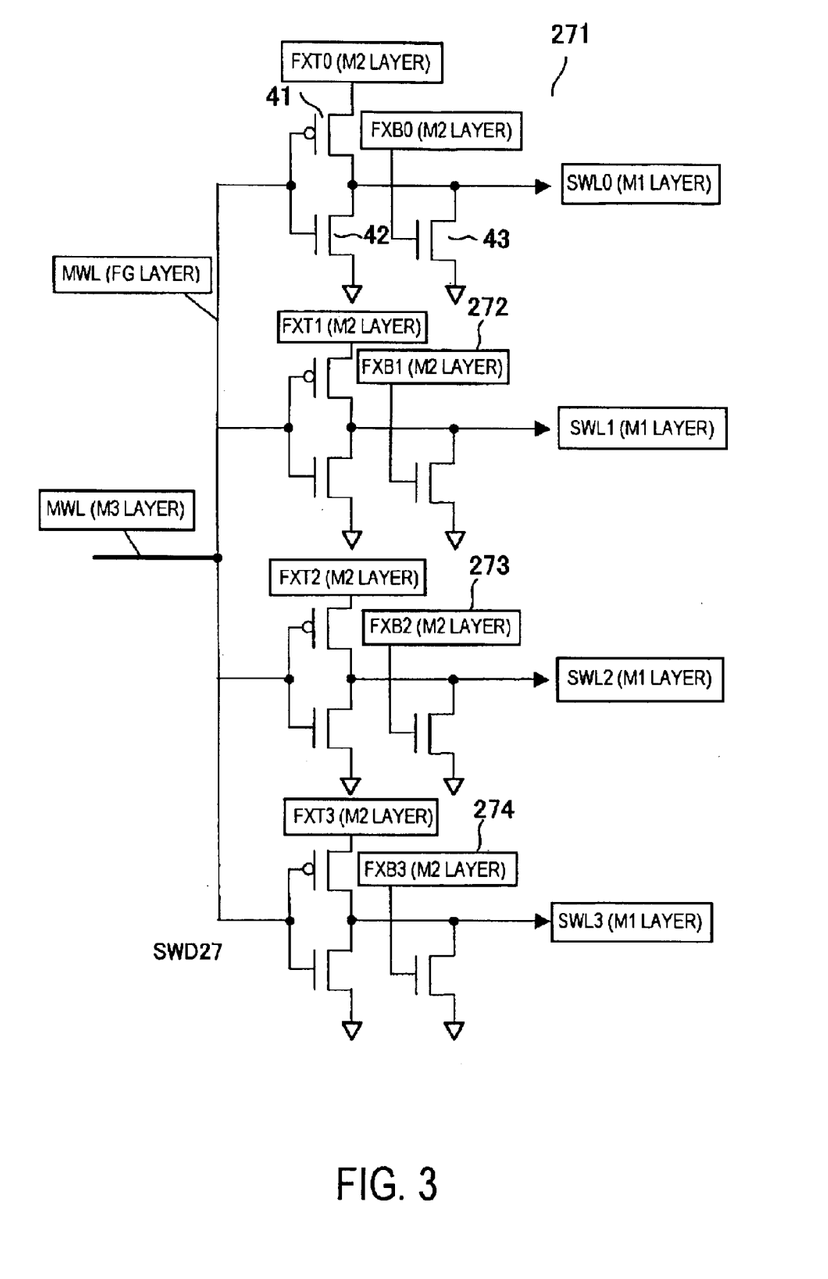
FIG. 3 is a circuit diagram of a sub-word driver arranged in each sub-word driver (SWD) area shown in FIG. 2.

The arrangement of each SWD area 27 shown in FIG. 1B will now be described in detail with reference to FIGS. 3, 4, and 5. FIG. 3 shows an example of a sub-word driver (SWD) circuit which is connected to the main word line MWL arranged in the M3 layer. The SWD circuit distributes main word signals to the sub-word lines SWL in accordance with sub-word selection signals FXT and FXB (subscripts are omitted). FIG. 3 shows a case in which the SWD circuit transmits a main word signal to any of four sub-word lines SWL. The SWD circuit comprises four SWD unit circuits 271 to 274. The complementary sub-word selection signals FXT and FXB (the subscripts are omitted) are supplied to each of the circuits 271 to 274. The SWD unit circuits 271 to 274 output sub-word selection signals to sub-word lines SWL0 to SWL3 in accordance with the sub-word selection signals FXT and FXB (the subscripts are omitted).

The SWD unit circuits 271 to 274 have the same structure and receive the different signals FXT and FXB. In this instance, the SWD unit circuit 271 will now be described as an example. The SWD unit circuit 271 comprises a PMOS transistor 41 and NMOS transistors 42 and 43. The gate of the PMOS transistor 41 is connected to that of the NMOS transistor 42. The NMOS transistor 43 is connected to a common node of the connected drains of the PMOS and NMOS transistors 41 and 42.

A sub-word selection signal FXT0 is supplied to the source of the PMOS transistor 41. A sub-word selection signal FXB0 is supplied to the gate of the NMOS transistor 43. The polarity of the signal FXT0 is different from that of the signal FXB0. In this structure, when a low level signal is supplied to the main word line MWL and a high level signal is supplied as the signal FXT0, the PMOS transistor 41 is turned on and the NMOS transistor 43 is turned off, so that the SWD unit circuit 271 enters a selection mode. Consequently, the SWD unit circuit 271 outputs a high level signal to the sub-word line SWL0. On the other hand, in a non-selection mode, the NMOS transistors 42 and 43 are turned on. Thus, the SWD unit circuit 271 outputs a low level signal to the sub-word line SWL0.

According to the first embodiment of the present invention, for the SWD unit circuits 271 to 274 having the foregoing structure shown in FIG. 3, the corresponding main word line MWL is arranged in the M3 layer. Lines for the sub-word selection signals FXT and FXB are disposed in the M2 layer under the M3 layer. Further, the sub-word lines SWL0 to SWL3 selected by the SWD unit circuits 271 to 274 are arranged in the M1 layer under the M2 layer. Therefore, it is necessary to electrically interconnect the M1 to M3 layers in the SWD circuit 27.

The interconnection will now be described in more detail with reference to FIG. 4. The left portion of FIG. 4 shows an actual interconnection between a diffusion layer in the substrate and the M1 layer. The right portion of FIG. 4 shows an actual interconnection between the M2 and M3 layers. As shown in the left portion of FIG. 4, each SWD circuit comprises an L layer, an FG layer, and the M1 layer. The L layer includes PMOS and NMOS device regions formed in the semiconductor substrate. The FG layer includes a polysilicon layer interconnecting the devices. The M1 layer is formed on the FG layer. The M1 layer includes the sub-word lines SWL0 to SWL3 extending in the X direction of FIG. 4. The sub-word lines SWL0 to SWL3 are electrically connected to the devices in the L layer through contacts. Further, as shown in the right portion of FIG. 4, the M2 layer includes sub-word selection lines FXT0 to FXB3 which are arranged in the Y direction at intervals. The sub-word selection lines FXT0 to FXB3 are connected to the device regions through the M1 layer at positions indicated by black circles. As is obvious from the line arrangement in the M2 layer in FIG. 4, power lines and signal lines are arranged between the lines FXT0 to FXT3 and the lines FXB0 to FXB3. Further, in the M3 layer, two main word lines MWL1 and MWL2 are arranged in the X direction with a certain separation. The main word lines MWL1 and MWL2 are connected to lines in the M2 layer, which is the lower layer, through two contacts C1 and C2. As mentioned above, in the interconnection structure, the total area of the contacts with the lower layers can be reduced. Advantageously, the spacing between the adjacent main word lines MWL can be widened. Therefore, two meshed lines MS1 and MS2 can be arranged between the main word lines MWL1 and MWL2 in FIG. 4.

Figure 4:
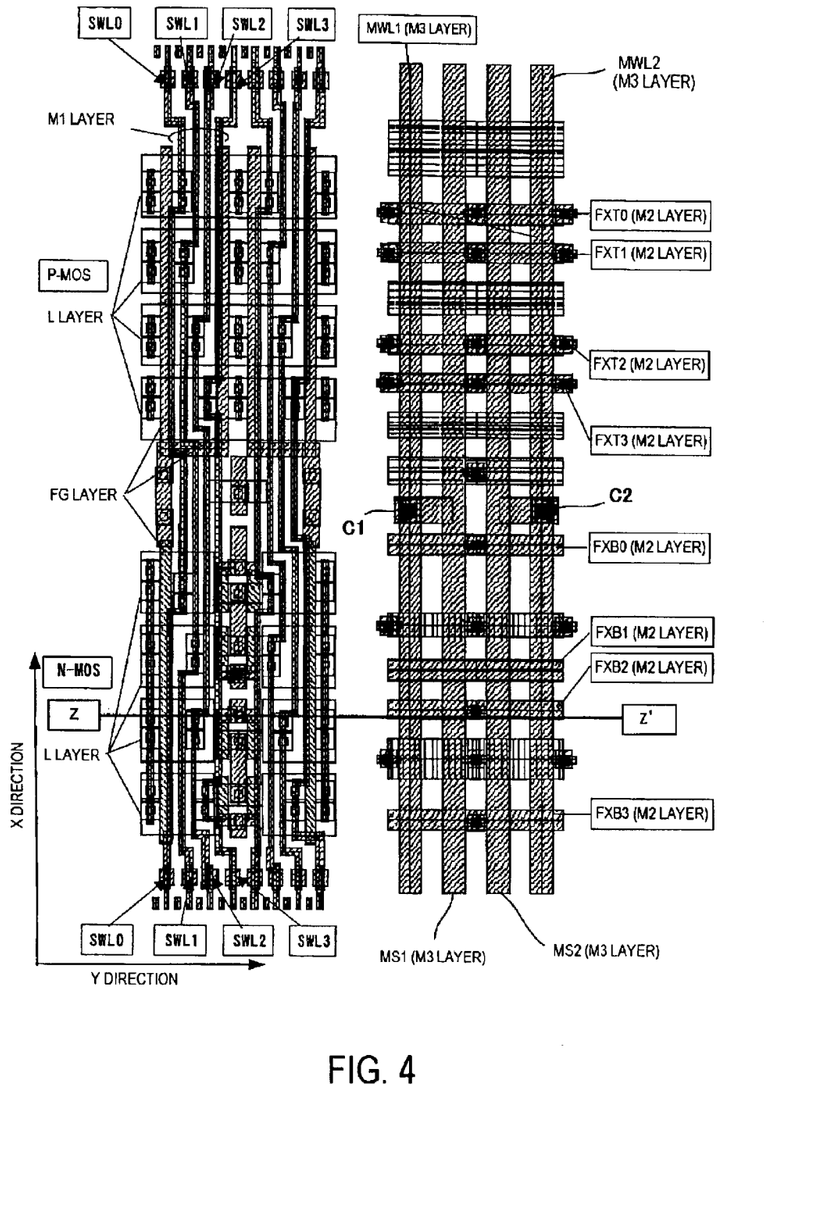
FIG. 4 is a diagram showing an actual interconnection of the sub-word driver shown in FIG. 3.
Figure 5:
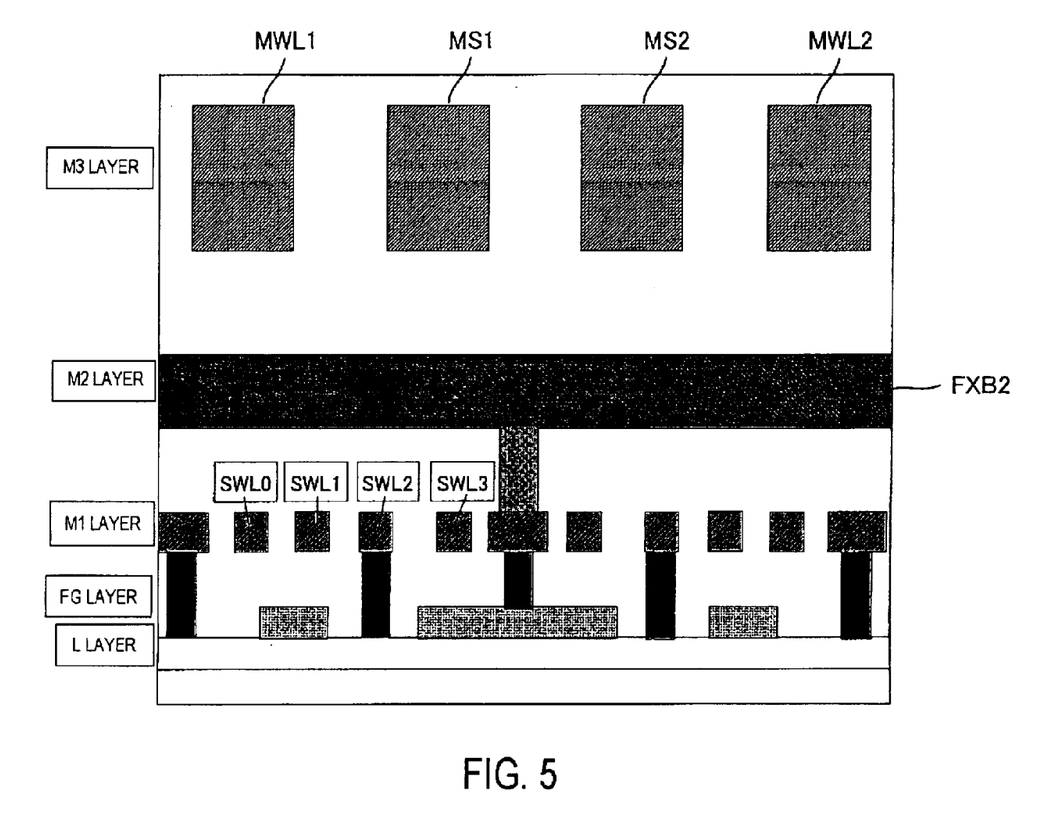
FIG. 5 is a sectional view of the interconnection structure of the sub-word driver at the line z–z' of FIG. 4.

FIG. 5 shows a sectional view of the interconnection at the line z–z' of FIG. 4. Referring to FIG. 5, in the M1 layer, the sub-word lines SWL0 to SWL3 are arranged in the X direction with a certain separation. The sub-word line SWL2 is connected to a device formed in the L layer under the M1 layer. Further, the sub-word selection line FXB2 is formed in the Y direction in the M2 layer. The line FXB2 is connected to the FG layer through an island formed in the M1 layer. The M3 layer is disposed on the M2 layer. The M3 layer includes the main word lines MWL1 and MWL2 and the meshed lines MS1 and MS2 in the Y direction. The meshed lines MS1 and MS2 are arranged between the main word lines MWL1 and MWL2. As is clear from FIG. 4, the total area of the contacts between the M2 and M3 layers can be reduced as much as possible. Accordingly, in this interconnection structure, the number of meshed lines MS used as power lines or signal lines can be increased.

In other words, when the signal lines FXT and FXB to select a word line and power lines are connected to the diffusion layer or gates, a pattern of islands is usually formed in the conventional SWD areas in the M2 layer. According to the present invention, the pattern of islands can be formed so as to correspond to the portions where the main word lines MWL are connected to the gates. Consequently, the limitation on the layout in the SWD areas can be remarkably reduced. Therefore, the separation between the sub-word lines SWL (in the M3 layer) can be sufficiently widened and be used for the arrangement of the meshed lines. The meshed lines MS are arranged in the SWD areas. In the conventional case, only one meshed line MS is arranged between two main word lines MWL. According to the present invention, the two meshed lines MS can be arranged between the two main word lines MWL, as shown in FIGS. 4 and 5.

Again referring to FIG. 2, the interconnection of the array according to the present invention will now be compared to the conventional one shown in FIG. 12 using the memory mat MAT. In the array interconnection according to the present invention, the M2 layer includes the lines extending in the Y direction and the M3 layer includes the lines extending in the X direction. As shown in FIGS. 4 and 5, there is no limitation on the layout of the meshed lines in the SWD area 27. Therefore, one meshed line MS can be arranged per main word line MWL. Thus, the 64 meshed lines MS can be arranged for each memory mat MAT, as mentioned above. Accordingly, it is possible to arrange the meshed lines whose number is larger than the necessary number of lines, namely, 52 signal lines and power lines extending from the row decoders XDEC to the array in the X direction.

The interconnection structure in the SA area will now be described with reference to FIGS. 6, 7, and 8.

Figure 6:
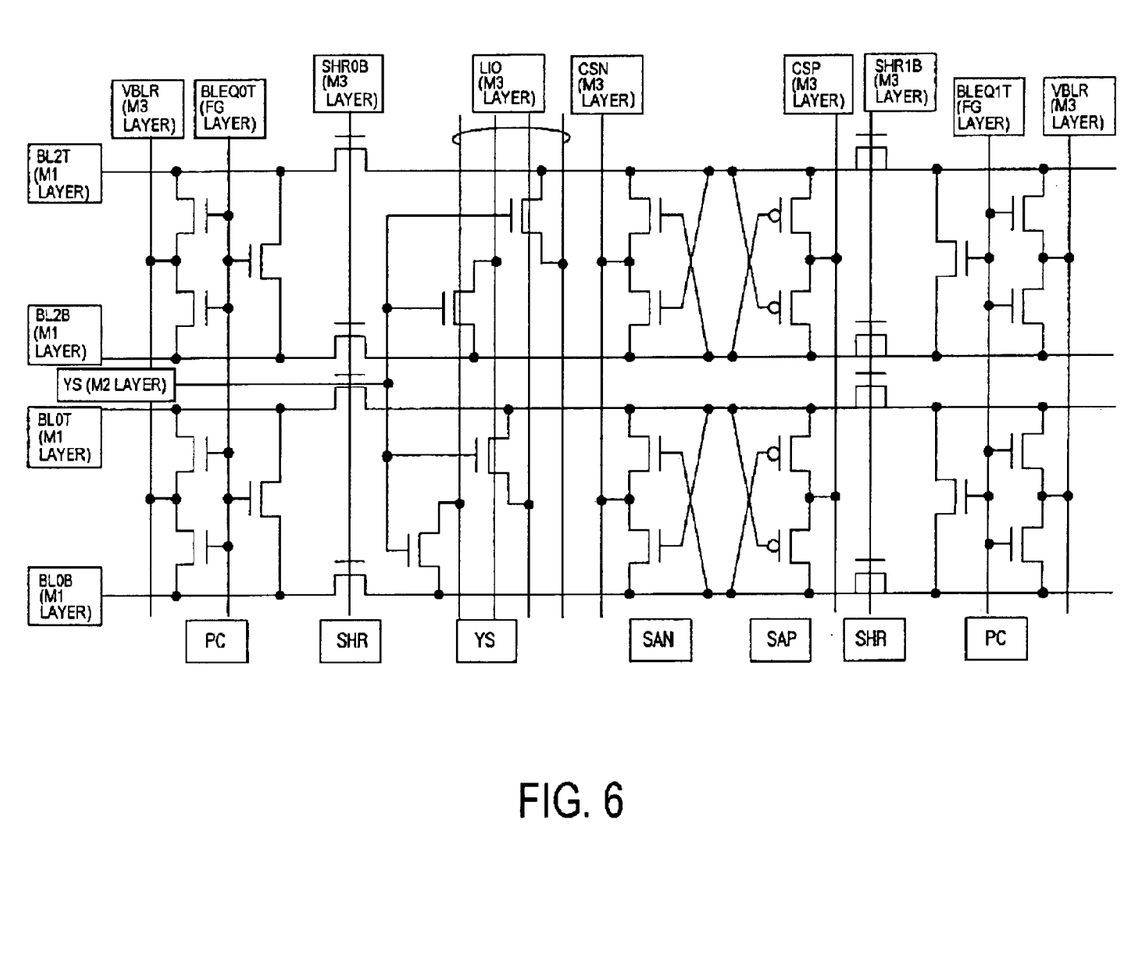
FIG. 6 is a diagram showing an example of sense amplifiers in each sense amplifier (SA) area shown in FIG. 2.

FIG. 6 shows a sense amplifier (SA) circuit having an interconnection structure suitable for the SWD area with the interconnection structure according to the present invention. In FIG. 6, the SA circuit comprises two sense amplifiers. The sense amplifiers are connected by two pairs of bit pair lines, namely, bit pair lines BL0T and BL0B and bit pair lines BL2T and BL2B. Each sense amplifier comprises precharge circuits PC, shared control circuits SHR, a YS circuit, an NMOS portion SAN, and a PMOS portion SAP. The NMOS portion SAN comprises two NMOS transistors. The two NMOS transistors are connected in series between the bit pair lines, with a common node therebetween. The respective gates of the two NMOS transistors are connected to the bit pair lines on the far sides. The common node between the two NMOS transistors is connected to a sense-amplifier drive line CSN. The PMOS portion SAP comprises two PMOS transistors. The two PMOS transistors are arranged in a manner similar to those in the NMOS portion SAN. The common node between the PMOS transistors is connected to a sense-amplifier drive line CSP.

The YS circuit comprises an NMOS transistor connected to the column selection line YS. The local I/O lines LIO are arranged on the YS circuit.

The shared sense-amplifier isolation circuits SHR for selectively isolating the portion SAN or SAP are arranged so as to sandwich the NMOS portion SAN and the PMOS portion SAP. Each of the circuits SHR comprises NMOS transistors. The gates of the NMOS transistors of the circuit SHR are connected to an isolation signal line SHR0B and those of the other circuit SHR are connected to an isolation signal line SHR1B. Each circuit SHR is connected to the corresponding precharge circuit PC. Each precharge circuit PC comprises NMOS transistors. The NMOS transistors of the precharge circuit are connected to a bit-line equalizer line BLEQ0T and a bit-line precharge-voltage supply line VBLR and those of the other precharge circuit are connected to a bit-line equalizer line BLEQ1T and the other bit-line precharge-voltage supply line VBLR.

The lines BLEQ0T and BLEQ1T are arranged in the FG layer on the substrate. The bit pair lines BL0T, BL0B, BL2T, and BL2B are disposed in the M1 layer. The interconnection is the same as that of the conventional layout.

The M2 layer includes the lines YS. On the other hand, the M3 layer includes the lines VBLR, SHR0B, SHR1B, LIO, CSN, and CSP. In other words, the sense-system signal lines, the lines LIO, and array power lines are arranged in the M3 layer and the lines YS and meshed power lines are arranged in the M2 layer. As mentioned above, since the sense-system signal lines, the lines LIO, and the array power lines are arranged in the M3 layer, the pattern of islands is formed in the M2 layer so as to correspond to the portions where the lines in the M3 layer are connected to the diffusion layer (L layer) and the gates in the SA areas. The M2 layer has no internal connection lines. Therefore, the same number of lines YS as that in the conventional layout can be used without being influenced by the layout of the lines YS and the mesh power lines in the M2 layer.

For the M3 layer, metal with lower sheet resistance than that of the M2 layer can be used. In addition, the M3 layer can be formed thicker than the M2 layer. Accordingly, the M3 layer can include lines each having a resistance lower than that of the line in the M2 layer. This fact means that among the lines shown in FIG. 6, the lines CSN and CSP affect the bit-line speed, and the lines CNS and CSP can be formed using a material with low resistance. In addition, it is not necessary to increase the width of each of the lines CSN and SCP. Thus, the size of the SA circuit with the interconnection structure shown in FIG. 6 can be reduced.

Figure 7:
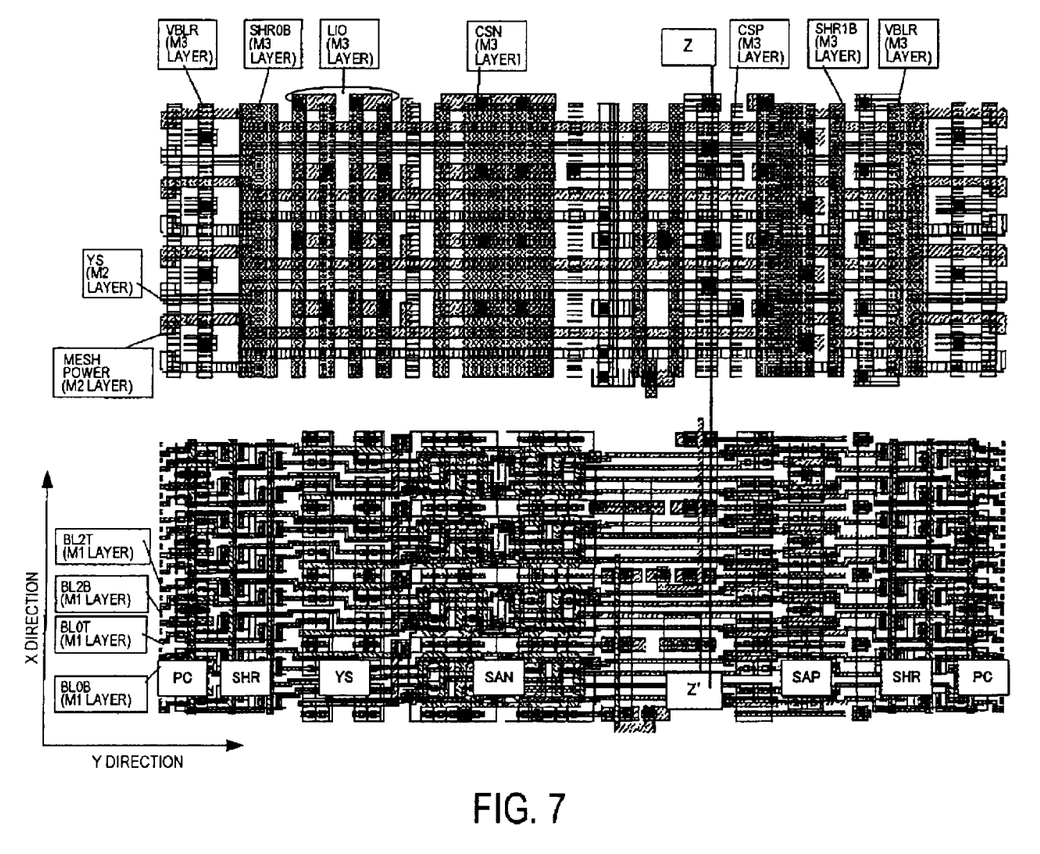
FIG. 7 is a diagram showing an actual interconnection of the sense amplifiers of FIG. 6.

FIG. 7 shows an actual interconnection of the SA circuit shown in FIG. 6. The upper portion of FIG. 7 shows an interconnection between the M2 and M3 layers. The lower portion of FIG. 7 shows the arrangement of lines in the M1 layer. As is clear from the arrangement in the M1 layer, the bit pair lines BL0T, BL0B, BL2T, and BL2B extend in the Y direction. The meshed lines and the lines YS are formed in the Y direction in the M2 layer. The lines VBLR, SHR0B, LIO, CSN, CSP, SHR1B, and VBLR are arranged in the X direction.

Figure 8:
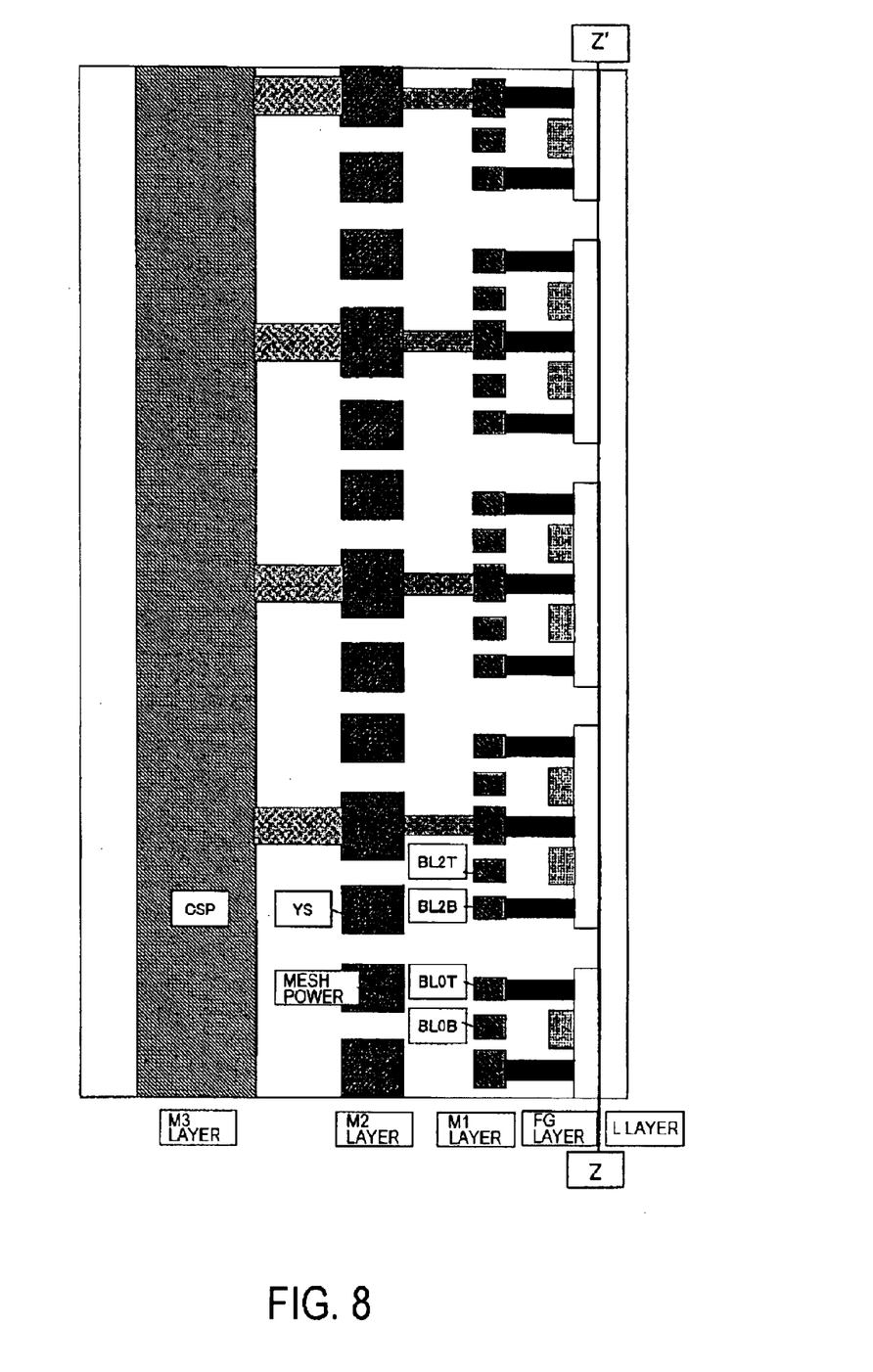
FIG. 8 is a sectional view of the interconnection structure of the sense amplifiers at the line z–z' of FIG. 7.

FIG. 8 shows a sectional view of the interconnection at the line z–z' of FIG. 7. Referring to FIG. 8, the line CSP in FIG. 7 is arranged in the M3 layer. The CSP line is connected to four islands formed in the M2 layer. The CSP line is further connected to the lines in the M1 layer and the FG layer through the islands. The M2 layer includes the lines YS and the meshed lines in addition to the pattern of the islands. The M1 layer includes the bit pair lines BL0T, BL0B, BL2T, BL2B, and the like.

Figure 9:
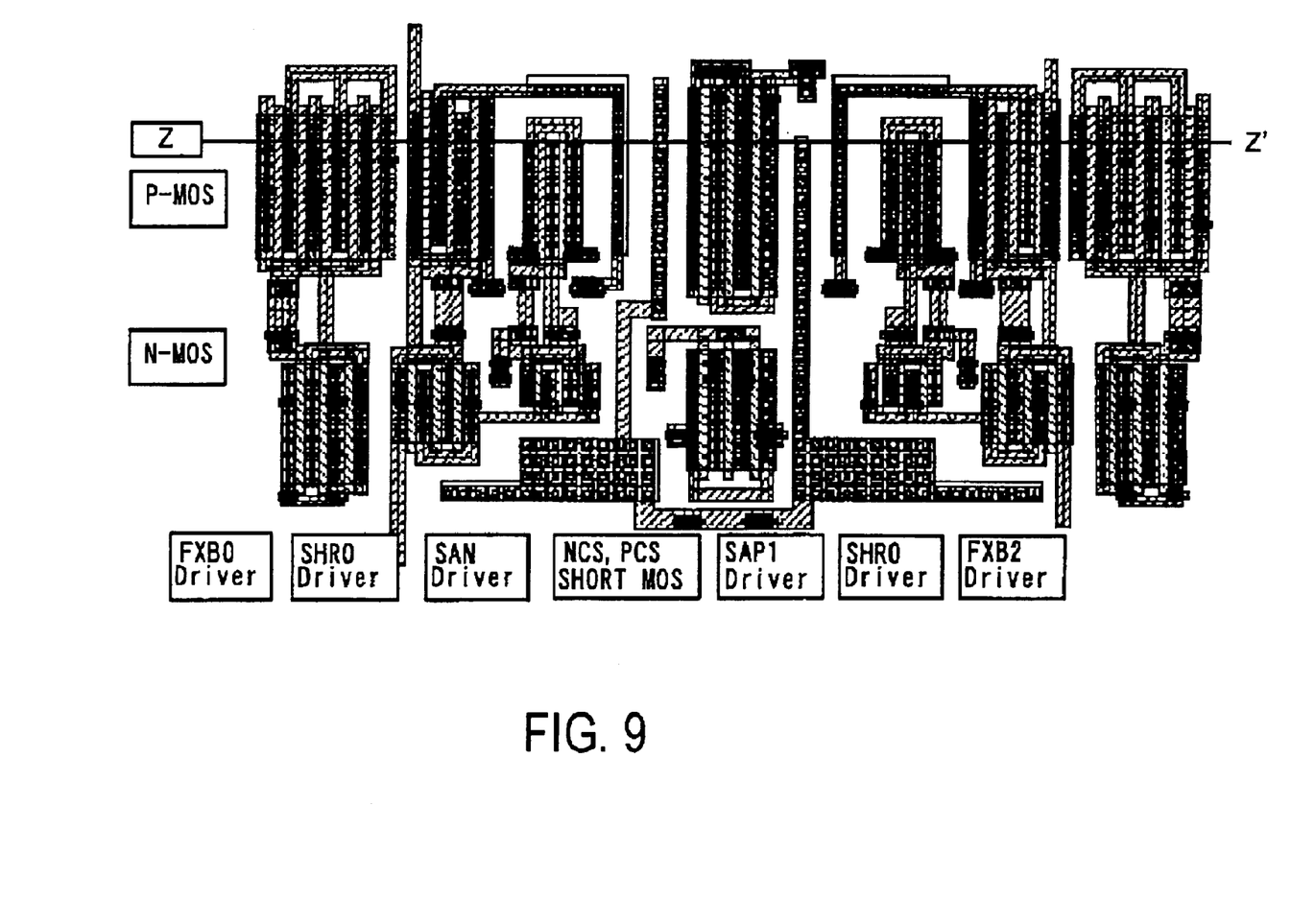
FIG. 9 shows an example of the arrangement of circuits in each crossing area shown in FIG. 2, FIG. 9 showing an actual line arrangement on a substrate.
Figure 10:
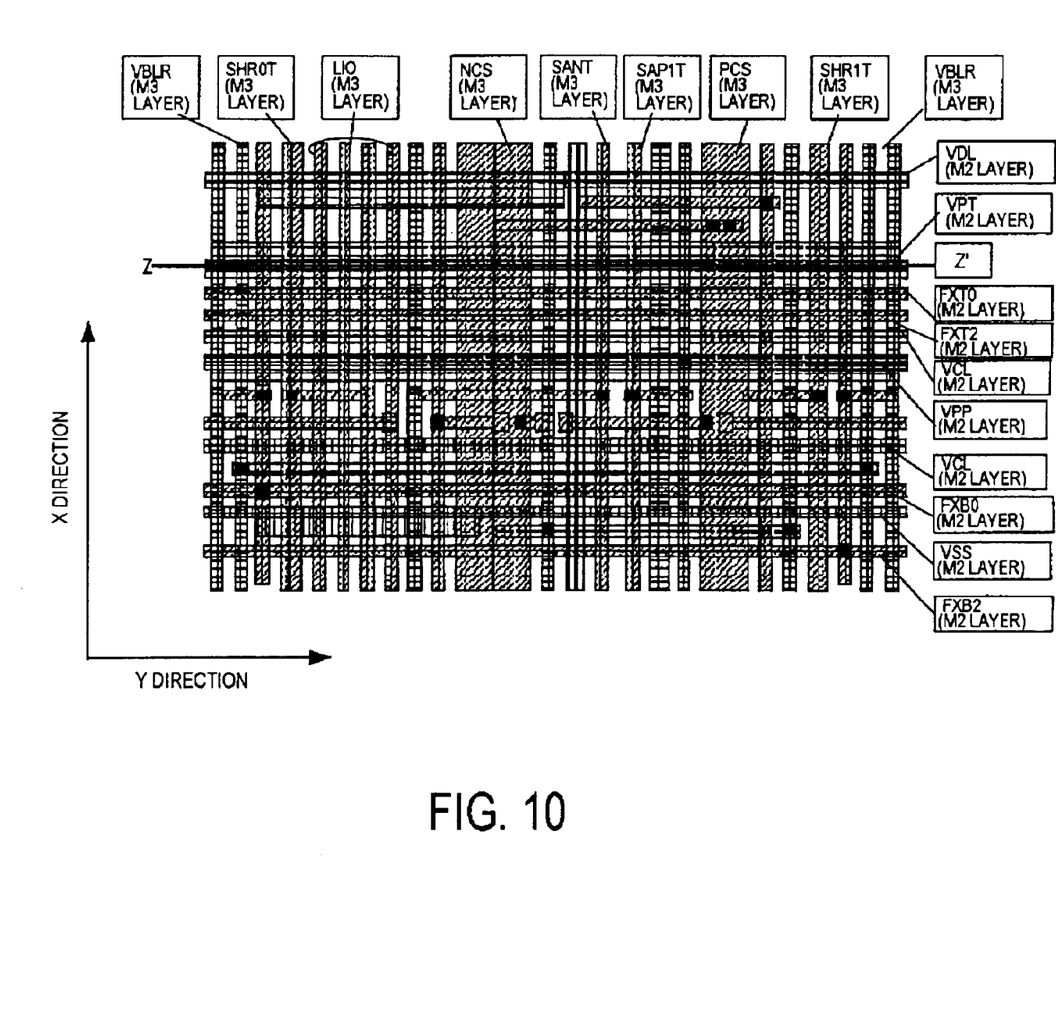
FIG. 10 is a diagram showing an actual line arrangement on the arrangement of FIG. 9.
Figure 11:
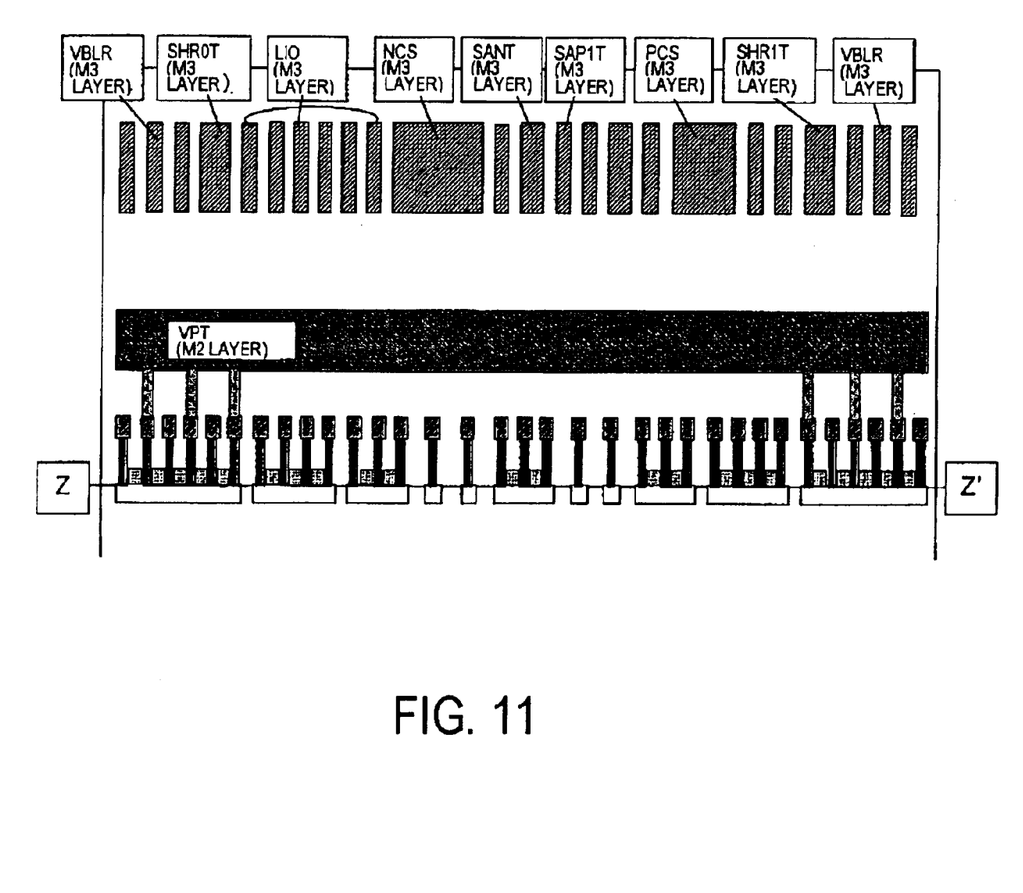
FIG. 11 is a sectional view of an interconnection structure comprising the line arrangements of FIGS. 9 and 10 at the line z–z'.

The interconnection structure in the crossing area will now be described with reference to FIGS. 9, 10, and 11. FIG. 9 shows a pattern of lines arranged between the L layer and the M1 layer. FIG. 10 shows a pattern of lines arranged between the M2 and M3 layers. FIG. 11 is a sectional view of an interconnection at the line z–z' of FIGS. 9 and 10, the interconnection comprising the lines in FIGS. 9 and 10. It is assumed that the crossing area has an FXB0 driver, an SHR0 driver, an SAN driver, an NCS/PCS short MOS, an SAP1 driver, an SHR0 driver, and an FXB2 driver. The FXB0 driver, the SHR0 driver, the SAN driver, the SAP1 driver, the SHR0 driver, and the FXB2 driver drive the corresponding lines shown in FIG. 6.

FIG. 10 shows lines arranged in the M2 and M3 layers in the crossing area. The M2 layer includes the lines corresponding to the lines in the SWD area, shown in FIG. 6, adjacent to the crossing area in the Y direction. The M3 layer includes the lines corresponding to the lines in the SA circuit adjacent to the crossing area in the X direction. Therefore, in addition to the sub-word selection lines FXT and FXB for the sub-word driver, various power lines (VDL, VPT, VCL, VPP, and VSS in FIG. 10) can be arranged in the M2 layer. These power lines can be directly connected to the diffusion layer under the M2 layer. Thus, the number of islands necessary for the connection can be reduced.

On the other hand, the sense-system signal lines for the sense amplifiers, the lines LIO, and the array power lines such as the lines VBLR and the like are arranged in the M3 layer. For the power lines for the sense amplifiers, it is necessary to form a pattern of islands in the M2 layer in order to connect the power lines in the M3 layer to the M1 layer. In each crossing area, the signal lines and the power lines used for the sense amplifiers are different from those used for the sub-word driver. In the M2 layer in the crossing area, therefore, the number of islands for the sense amplifiers is different from the number of islands for the sub-word driver. For example, in the actual interconnection of FIG. 10, the number of islands for the signal lines and the power lines in the M2 layer is 13. On the other hand, the number of islands for those in the M3 layer is 8.

Accordingly, the number of islands formed in the M2 layer of this interconnection structure is smaller than that of the conventional interconnection structure by 5. Thus, simpler layout can be realized.

In the above embodiment, only the interconnection in the crossing area has been described. The present invention can also be applied to a semiconductor memory device in which a sub-amplifier is provided in each of the crossing areas and the sub-amplifier is connected to local I/O lines LIO formed in the M3 layer. The present invention can also be applied to a semiconductor memory device in which a CMOS switch is provided in each of the crossing areas. Further, the present invention can also be applied to a semiconductor memory device in which sub-amplifiers are arranged outside banks.

What is claimed is:

1. A semiconductor memory device comprising:
   a plurality of memory mats each including a plurality of memory cells arranged along columns and along rows, the columns being arranged in the Y direction, the rows being arranged in the X direction;
   sense amplifier areas arranged around each memory mat so as to intersect the Y direction; and
   sub-word driver areas arranged around each memory mat so as to intersect the X direction, wherein
      column selection lines and main ward lines are arranged on the memory mats, the column selection lines extending in the Y direction, the main word lines extending in the X direction, and a layer including the column selection lines is disposed under a layer including the main word lines.

2. The device according to claim 1, wherein each of the sub-word driver areas comprises a layer including sub-word selection lines and the layer including the main word lines, and the layer including the main word lines is disposed on the layer including the sub-word selection lines.

3. The device according to claim 2, wherein a layer including sub-word lines is arranged as a first metal layer under the layer including the sub-word selection lines, and the layer including the sub-word selection lines is disposed as a second metal layer.

4. The device according to claim 3, wherein the main word lines are arranged in the X direction at predetermined intervals, the layer including the main word lines is arranged as a third metal layer on the second metal layer, and the third metal layer further includes a power line extending in the X direction between the adjacent main word lines.

5. The device according to claim 4, wherein a plurality of power lines are arranged between the adjacent main word lines.

6. The device according to claim 3, wherein the first metal layer includes a pattern of islands connected to the sub-word selection lines.

7. The device according to claim 1, wherein each of the sense amplifier areas comprises a first metal layer including bit pair lines extending in the Y direction and a second metal layer including the column selection lines, and the second metal layer including the column selection lines is disposed on the first metal layer.

8. The device according to claim 7, wherein each of the sense amplifier areas has device regions constituting sense amplifiers arranged in a layer under the first metal layer, a third metal layer including power lines and signal lines electrically connected to the device regions is arranged on the second metal layer, and the power lines and the signal lines in the third metal layer extend in the X direction.

9. The device according to claim 8, wherein the second metal layer including the column selection lines has a pattern of islands through which the power lines and the signal lines in the third metal layer connect to the device regions.

10. The device according to claim 9, wherein the pattern of islands is formed in the second metal layer so as to correspond to sense-amplifier drive lines arranged in the third metal layer, and the islands are connected to the respective sense-amplifier drive lines.

11. The device according to claim 1, further comprising:

crossing areas which are arranged around each memory mat and where the sense amplifier areas and the sub-word driver areas are not formed, wherein each of the crossing areas includes first lines connected to the lines arranged in the adjacent sub-word driver area and second lines connected to the lines arranged in the adjacent sense amplifier area.

12. The device according to claim 11, wherein the first lines are arranged in a layer under a layer including the second lines.

13. The device according to claim 12, wherein the first lines include sub-word selection lines connected to the sub-word selection lines arranged in the adjacent sub-word driver area and power lines, and the second lines include power lines for driving the sense amplifiers in the adjacent sense amplifier area.

14. The device according to claim 1, further comprising:

crossing areas which are arranged around each memory mat and where the sense amplifier areas and the sub-word driver areas are not formed, wherein each of the crossing areas includes a sub-amplifier connected to sense amplifiers arranged in the adjacent sense amplifier area.

15. The device according to claim 14, further comprising:

crossing areas which are arranged around each memory mat and where the sense amplifier areas and the sub-word driver areas are not formed, wherein each of the crossing areas includes a CMOS switch.

16. A semiconductor memory device comprising:

sub-word driver areas including main word lines and sub-word selection lines, wherein a layer including the sub-word selection lines is disposed under a layer including the main word lines.

17. The device according to claim 16, wherein the main word lines are arranged at intervals and extend in the X direction so as to connect to main word lines of memory mats, and the sub-word selection lines are arranged in the layer under the layer including the main word lines and extend in the Y direction intersecting the X direction.

18. The device according to claim 17, wherein sub-word lines are arranged in the X direction in a layer under the layer including the sub-word selection lines.

19. The device according to claim 18, wherein a plurality of power lines are arranged in the X direction between the adjacent main word lines.

20. The device according to claim 17, wherein a plurality of power lines are arranged in the X direction between the adjacent main word lines.

21. The device according to claim 16, wherein a plurality of power lines are arranged in the X direction between the adjacent main word lines.

* * * * *